US012607650B2

(12) United States Patent
Lin et al.

(10) Patent No.: US 12,607,650 B2
(45) Date of Patent: Apr. 21, 2026

(54) TESTING DEVICE AND ITS ADAPTER HOLDER

(71) Applicant: CHROMA ATE INC., Taoyuan City (TW)

(72) Inventors: Ching-Li Lin, Taoyuan City (TW); Kao-Shan Yang, Taoyuan City (TW)

(73) Assignee: CHROMA ATE INC., Taoyuan City (TW)

( * ) Notice: Subject to any disclaimer, the term of this patent is extended or adjusted under 35 U.S.C. 154(b) by 112 days.

(21) Appl. No.: 18/638,163

(22) Filed: Apr. 17, 2024

(65) Prior Publication Data

US 2025/0012830 A1    Jan. 9, 2025

(30) Foreign Application Priority Data

Jul. 7, 2023    (TW) .................................. 112207097

(51) Int. Cl.
*G01R 1/04*        (2006.01)
*H05K 7/12*        (2006.01)
*H05K 7/14*        (2006.01)

(52) U.S. Cl.
CPC ............. *G01R 1/0416* (2013.01); *H05K 7/12* (2013.01); *H05K 7/142* (2013.01)

(58) Field of Classification Search
CPC ........ G01R 1/0416; G01R 1/04; G01R 31/28; H05K 7/12; H05K 7/142
See application file for complete search history.

(56) References Cited

U.S. PATENT DOCUMENTS

| | | | | |
|---|---|---|---|---|
| 8,982,566 | B2 * | 3/2015 | Huang | ................. H01R 12/721 |
| | | | | 361/748 |
| 2009/0108859 | A1 * | 4/2009 | Teng | .................. G01R 31/2889 |
| | | | | 324/756.01 |
| 2013/0308280 | A1 * | 11/2013 | Huang | .................... G06F 1/185 |
| | | | | 361/729 |
| 2016/0294090 | A1 * | 10/2016 | Yang | .................... H05K 3/3405 |
| 2017/0250504 | A1 * | 8/2017 | Bang | ...................... H01R 13/26 |
| 2022/0393388 | A1 * | 12/2022 | Liu | ...................... H01R 13/516 |

* cited by examiner

*Primary Examiner* — Alvaro E Fortich
(74) *Attorney, Agent, or Firm* — CKC & Partners Co., LLC

(57)    ABSTRACT

An adapter bracket includes a holder and a fixing element. The holder includes a first strip-shaped body and a second strip-shaped body. The first strip-shaped body is formed with a plurality of first notches linearly arranged on a first coupling surface of the first strip-shaped body. The second strip-shaped body is formed with a plurality of second notches linearly arranged on a second coupling surface of the second strip-shaped body. The fixing element detachably couples the first strip-shaped body and the second strip-shaped body together, so that the first coupling surface and the second coupling surface are in contact with each other, and the first notches and the second notches are jointly combined into a plurality of fastening holes arranged linearly, and each of the fastening holes can hold an object therein.

7 Claims, 12 Drawing Sheets

C-C

1

TESTING DEVICE AND ITS ADAPTER HOLDER

RELATED APPLICATIONS

This application claims the benefit of Taiwan Application Serial Number 112207097 filed on Jul. 7, 2023, which is herein incorporated by reference in its entirety.

BACKGROUND

Field of Disclosure

The present disclosure relates to a testing device. More particularly, the present disclosure relates to a testing device having an adapter holder.

Description of Related Art

A conventional probe device includes a probe head and a test stage. By moving the probe head down to the test stage, the probe head is directed downward to contact one of semiconductor components on the test stage, and the semiconductor components are electrically tested to filter out any defective semiconductor component. Previously, a working module (e.g., radio frequency module, RF module) in the probe head is electrically connected to a load board through adapters, so as to facilitate the transmission of signals between the working module and the load board, thereby performing the above-mentioned electrical detection work.

However, because working modules with different models or brands use specific sizes and the same number of adapters in order to carry out the electrical detection work, thus, labor costs, equipment costs and testing time will not be consumed. Hence, how to effectively grasp the adapters of these specific specifications without affecting the above-mentioned detection work will be an urgent and important issue for the relevant industry.

SUMMARY

One aspect of the present disclosure is to provide a testing device and its adapter holder for solving the difficulties mentioned above in the prior art.

In one embodiment of the present disclosure, an adapter holder is provided, and the adapter holder includes a holder body and at least one first fixing element. The holder body includes a first strip-shaped body and a second strip-shaped body. The first strip-shaped body includes a first main body and a plurality of first notches. The first main body includes two first adjoining surfaces which are opposite to each other, and a first coupling surface adjoined with the first adjoining surfaces. The first notches are linearly arranged on the first coupling surface. Each of the first notches is connected to the first adjoining surfaces. The second strip-shaped body includes a second main body and a plurality of second notches. The second main body includes two second adjoining surfaces which are opposite to each other, and a second coupling surface adjoined with the second adjoining surfaces. The second notches are linearly arranged on the second coupling surface, and each of the second notches connected to the second adjoining surfaces. The first fixing element detachably couples the first strip-shaped body and the second strip-shaped body together, so that the first coupling surface and the second coupling surface are physically connected together, and the first notches and the second notches are jointly combined to form a plurality of first fastening holes linearly arranged. Each of the first fastening holes is used to fix an object therein.

According to one or more embodiments of the present disclosure, in the adapter holder, the first strip-shaped body further includes at least one shaft-received hole disposed on the first coupling surface. The second strip-shaped body further comprises at least one positioning shaft disposed on the second coupling surface. When the positioning shaft is aligned with and inserted into the shaft-received hole, the first notches are aligned with, and connected to the second notches one by one.

According to one or more embodiments of the present disclosure, in the adapter holder, each of the first notches is formed with a first section and a second section connected to each other. The first section is connected to one of the first adjoining surfaces, and the second section is connected to the other of the first adjoining surfaces. Each of the second notches is formed with a third section and a fourth section connected to each other, the third section is connected to one of the second adjoining surfaces, and the fourth section is connected to the other of the second adjoining surfaces. When the first coupling surface and the second coupling surface are physically connected together, a caliber of a first space jointly formed by the first section and the third section is smaller than a caliber of a second space jointly formed by the second section and the fourth section.

According to one or more embodiments of the present disclosure, in the adapter holder, an inner wall of the first section is provided with a first clamping plane, and an inner wall of the third section is provided with a second clamping plane. When the first coupling surface and the second coupling surface are physically connected together, the object is jointly sandwiched by the first clamping plane and the second clamping plane.

According to one or more embodiments of the present disclosure, in the adapter holder, the first strip-shaped body further includes at least one first lug protrusively disposed on a first outer surface of the first main body facing away from the first coupling surface, and a first positioning hole formed on the at least one first lug. The second strip-shaped body further includes at least one second lug protrusively disposed on a second outer surface of the second main body facing away from the second coupling surface, and a second positioning hole formed on the at least one second lug.

According to one or more embodiments of the present disclosure, in the adapter holder, the holder body further includes a third strip-shaped body and at least one second fixing element. The third strip-shaped body has a third main body and a plurality of third notches. The third main body includes two third adjoining surfaces which are opposite to each other, and a third coupling surface adjoined with the third adjoining surfaces and facing towards the second main body, the third notches are linearly arranged on the third coupling surface, and each of the third notches is connected to the third adjoining surfaces. The second main body further includes a fourth coupling surface adjoined with the second adjoining surfaces and facing away from the first main body, and the second strip-shaped body further includes a plurality of fourth notches linearly arranged on the fourth coupling surface. The second fixing element detachably couples the third strip-shaped body and the second strip-shaped body together, so that the third coupling surface and the fourth coupling surface are physically connected together, and the third notches and the fourth notches are jointly combined to form a plurality of second fastening holes linearly arranged, wherein each of the second fastening holes is used to fix another object therein.

In one embodiment of the present disclosure, a testing device is provided, and the testing device includes a base, a load board module, at least one working module and a transferring device. The load board module includes a circuit board, a first circuit interface, an upper connection module and at least one working module. The circuit board covers the base. The first circuit interface is disposed on one surface of the circuit board. The upper connection module is fixedly connected to the surface of the circuit board, and electrically connected to the first circuit interface. The working module is fixedly disposed within the base, and provided with a second circuit interface. The transferring device includes a support plate and a lower connection module. The support plate is fixed between the working module and the load board module. The lower connection module includes a plurality of lower adapter units and the aforementioned adapter holder. The adapter holder is fixed on the support plate, and each of the lower adapter units is held within one of the first fastening holes and electrically connected to the second circuit interface and the upper connection module, respectively.

According to one or more embodiments of the present disclosure, in the testing device, the first circuit interface includes a plurality of connectors. The load board module further includes a plurality of partition columns, and the upper connection module includes a strip-shaped frame, a bracket element and a plurality of upper adapter units. The strip-shaped frame is spacedly disposed on the surface of the circuit board through the partition columns. The bracket element is fixedly disposed on the strip-shaped frame, and includes a plurality of through holes linearly arranged on the bracket element. Each of the upper adapter units is held within one of the through holes and electrically connected to one of the connectors.

According to one or more embodiments of the present disclosure, in the testing device, the transferring device further includes a moving assembly. The moving assembly is slidably disposed on the support plate, and the moving assembly includes a handle, two pillar shafts and two grooves. The handle is pivotally connected to one end of each of the pillar shafts. Each of the pillar shafts is formed with a top surface and a side surface adjoined with the top surface, and the side surfaces of the pillar shafts faced with each other. The grooves are respectively formed on the side surfaces of the pillar shafts, and the pillar shafts are arranged parallel to each other. Each of the grooves includes an inlet and a sloping area. The inlet is collectively formed on the top surface and the side surface of the corresponding one of the pillar shafts. The sloping area is disposed on the side surface of the corresponding one of the pillar shafts, connected to the inlet, and gradually sloping in a direction of the working module and the handle from the top surface.

According to one or more embodiments of the present disclosure, in the testing device, the upper connection module further includes a plurality of wheels respectively pivoted to two opposite sides of the strip-shaped frame. When the wheels move to the sloping areas from the inlets of the grooves synchronously, the upper connection module is guided to vertically descend to the lower connection module by the moving assembly so that each of the upper adapter units is inserted into one of the lower adapter units.

In one embodiment of the present disclosure, a testing device is provided, and the testing device includes a working module, a transferring device, a plurality of lower adapter units, a load board module, a bracket element and a plurality of upper adapter units. The transferring device includes an adapter holder and a plurality of first fastening holes linearly arranged on the adapter holder. The lower adapter units are at least partially fastened within the first fastening holes, and electrically connected to the working module. The bracket element is connected to the load board module, and elevatably disposed on the adapter holder. The upper adapter units are respectively held on the bracket element and electrically connected to the load board module. When the bracket element is guided to vertically descend downwardly by the transferring device, the upper adapter units insert into the lower adapter units, respectively.

According to one or more embodiments of the present disclosure, in the testing device, the adapter holder includes a first strip-shaped body, a second strip-shaped body and at least one first fixing element. The first strip-shaped body includes a first main body and a plurality of first notches linearly arranged on a first coupling surface of the first main body. The second strip-shaped body includes a second main body and a plurality of second notches linearly arranged on a second coupling surface of the second main body. The first fixing element detachably couples the first strip-shaped body and the second strip-shaped body together, so that the first coupling surface and the second coupling surface are physically connected together, and the first notches and the second notches are jointly combined to form the first fastening holes.

According to one or more embodiments of the present disclosure, in the testing device, the first strip-shaped body further includes at least one shaft-received hole disposed on the first coupling surface. The second strip-shaped body further includes at least one positioning shaft disposed on the second coupling surface. When the positioning shaft is aligned with and inserted into the shaft-received hole, the first notches are aligned with, and connected to the second notches one by one.

According to one or more embodiments of the present disclosure, in the testing device, each of the first notches is formed with a first section and a second section connected to each other. Each of the second notches is formed with a third section and a fourth section connected to each other. When the first coupling surface and the second coupling surface are physically connected together, a caliber of a first space jointly formed by the first section and the third section is smaller than a caliber of a second space jointly formed by the second section and the fourth section.

According to one or more embodiments of the present disclosure, in the testing device, an inner wall of the first section is provided with a first clamping plane, and an inner wall of the third section is provided with a second clamping plane. When the first coupling surface and the second coupling surface are physically connected together so as to jointly couple the first section and the third section, one of the lower adapter units is jointly sandwiched by the first clamping plane and the second clamping plane.

According to one or more embodiments of the present disclosure, in the testing device, the first strip-shaped body further includes at least one first lug protrusively disposed on a first outer surface of the first main body facing away from the first coupling surface, and a first positioning hole formed on the first lug. The second strip-shaped body further includes at least one second lug protrusively disposed on a second outer surface of the second main body facing away from the second coupling surface, and a second positioning hole formed on the second lug.

According to one or more embodiments of the present disclosure, in the testing device, the adapter holder further includes a third strip-shaped body and at least one second fixing element. The third strip-shaped body has a third main body and a plurality of third notches linearly arranged on a third coupling surface of the third main body. The second strip-shaped body further includes a plurality of fourth notches linearly arranged on a fourth coupling surface of the third main body facing away from the first main body. The second fixing element detachably couples the third strip-shaped body and the second strip-shaped body together, so that the third coupling surface and the fourth coupling surface are physically connected together, and the third notches and the fourth notches are jointly combined to form a plurality of second fastening holes linearly arranged, wherein the lower adaptor units are held within the first fastening holes and the second fastening holes, respectively.

According to one or more embodiments of the present disclosure, in the testing device, the transferring device further includes a moving assembly. The moving assembly includes a handle, two pillar shafts and two grooves. The handle is pivotally connected to one end of each of the pillar shafts. Each of the pillar shafts is formed with a top surface and a side surface adjoined with the top surface, and the side surfaces of the pillar shafts faced with each other. The grooves are respectively formed on the side surfaces of the pillar shafts, and the pillar shafts are arranged parallel to each other. Each of the grooves includes an inlet and a sloping area. The inlet is collectively formed on the top surface and the side surface of the corresponding one of the pillar shafts, the sloping area is disposed on the side surface of the corresponding one of the pillar shafts, connected to the inlet, and gradually sloping in a direction of the working module and the handle from the top surface.

According to one or more embodiments of the present disclosure, in the testing device, the load board module further includes a strip-shaped frame and a plurality of wheels respectively pivoted to two opposite sides of the strip-shaped frame, and the bracket element is fixed on the strip-shaped frame. When the wheels move to the sloping areas from the inlets of the grooves synchronously, the strip-shaped frame is guided to vertically descend to the adapter holder by the moving assembly so that each of the upper adapter units inserts into one of the lower adapter units.

Thus, through the construction of the embodiments above, the adapter holder of the disclosure can comfort with specific sizes of adapters so as to effectively hold these adapters, thereby reducing labor costs, equipment costs and testing time.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DETAILED DESCRIPTION

Figure 1:
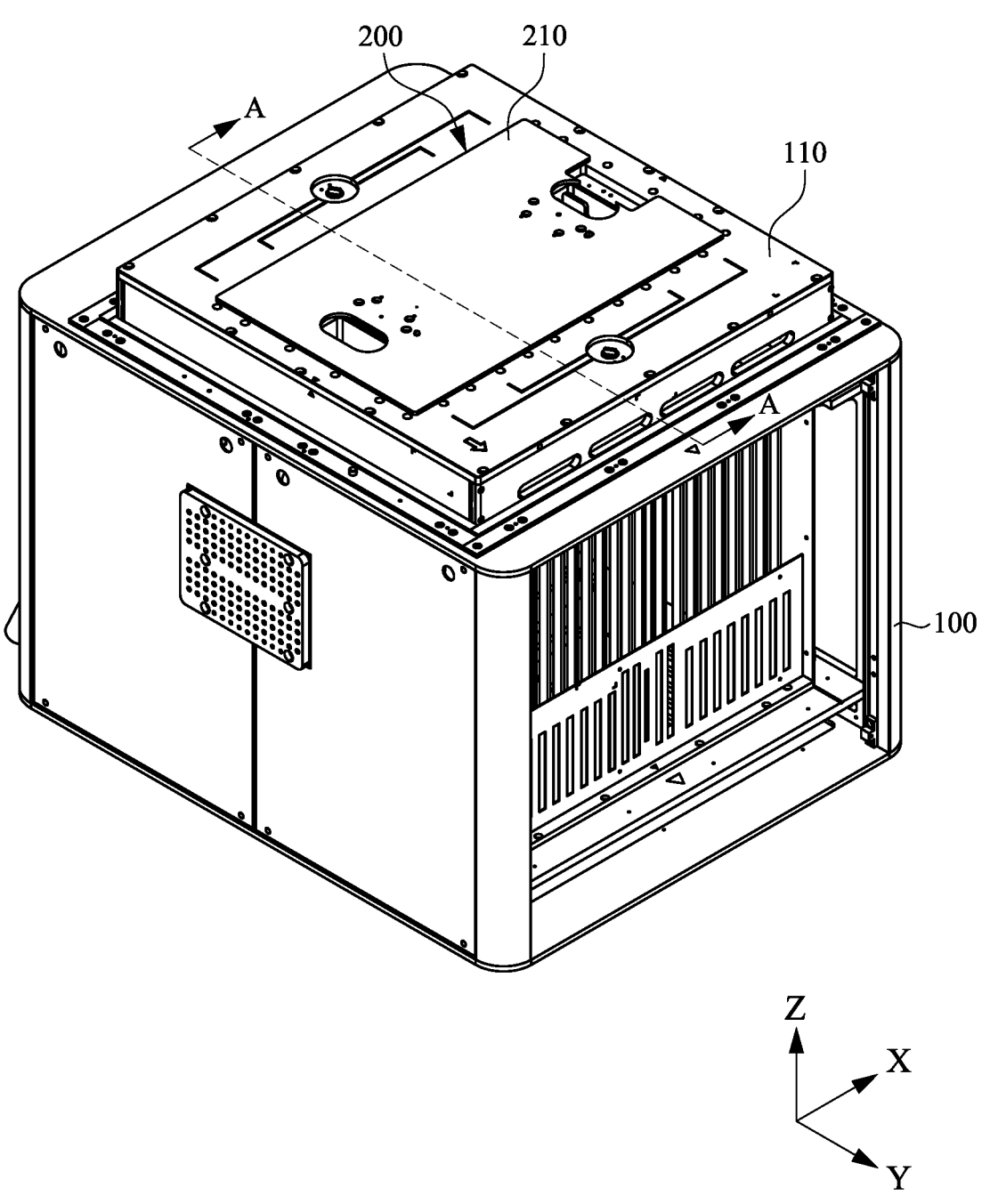
FIG. 1 is a perspective view of a testing device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
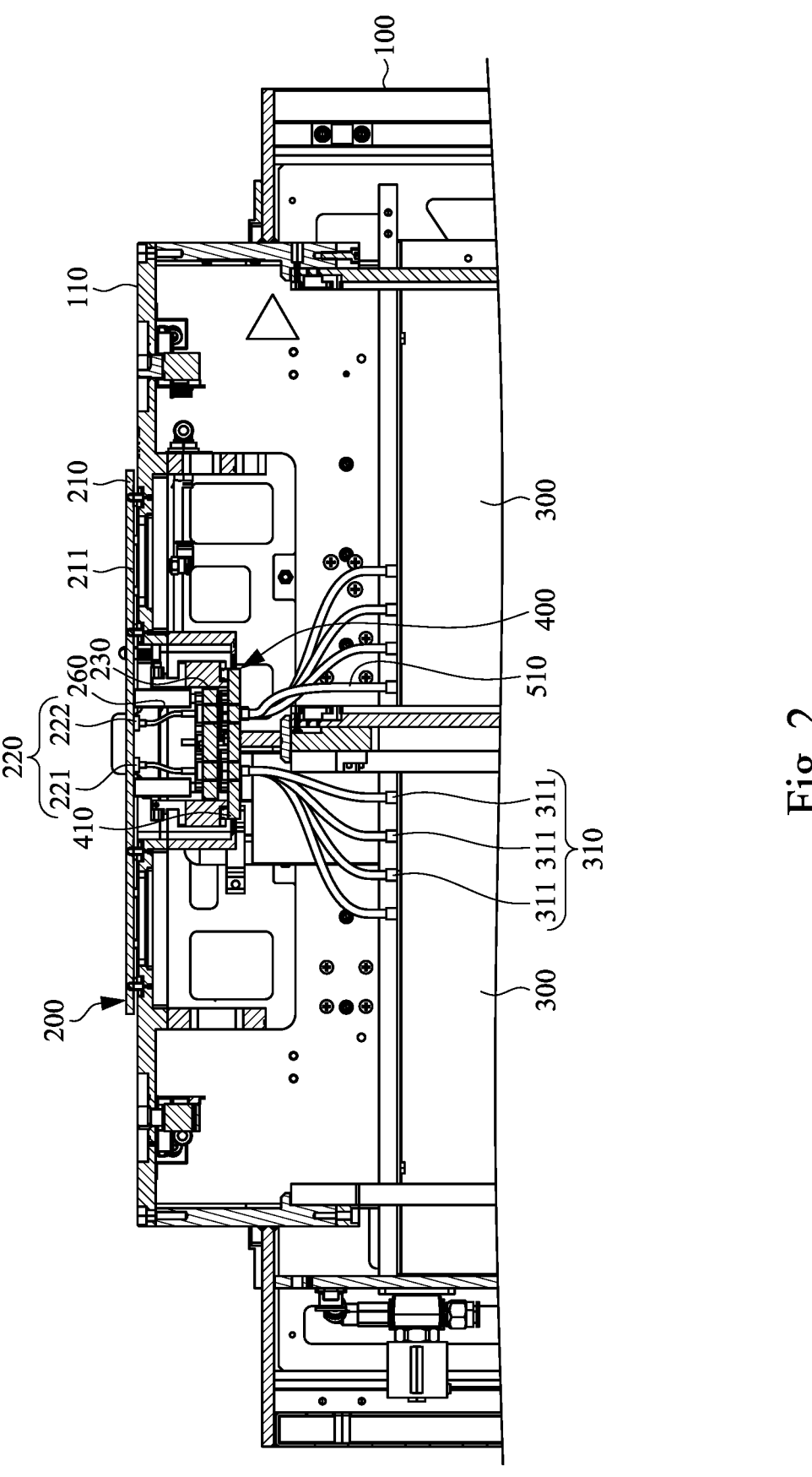
FIG. 2 is a cross-sectional view of the testing device viewed along a line AA of FIG. 1.

Reference is now made to FIG. 1 and FIG. 2, in which FIG. 1 is a perspective view of a testing device 10 according to one embodiment of the present disclosure, and FIG. 2 is a cross-sectional view of the testing device 10 viewed along a line AA of FIG. 1. As shown in FIG. 1 and FIG. 2, the testing device includes a base 100, a load board module 200, a working module 300 and a transferring device 400. The load board module 200, the working module 300 and the transferring device 400 are all fixedly arranged on the base 100, and the transferring device 400 is located between the load board module 200 and the working module 300 and electrically connected to the load board module 200 and the working module 300. The load board module 200 is able to exchange signals with the working module 300 through the transferring device 400. More specifically, the working module 300 and the transferring device 400 are respectively located in the base 100, one part of the load board module 200 is located within the base 100, and the remaining part of the load board module 200 covers a top surface 110 of the base 100.

Figure 3:
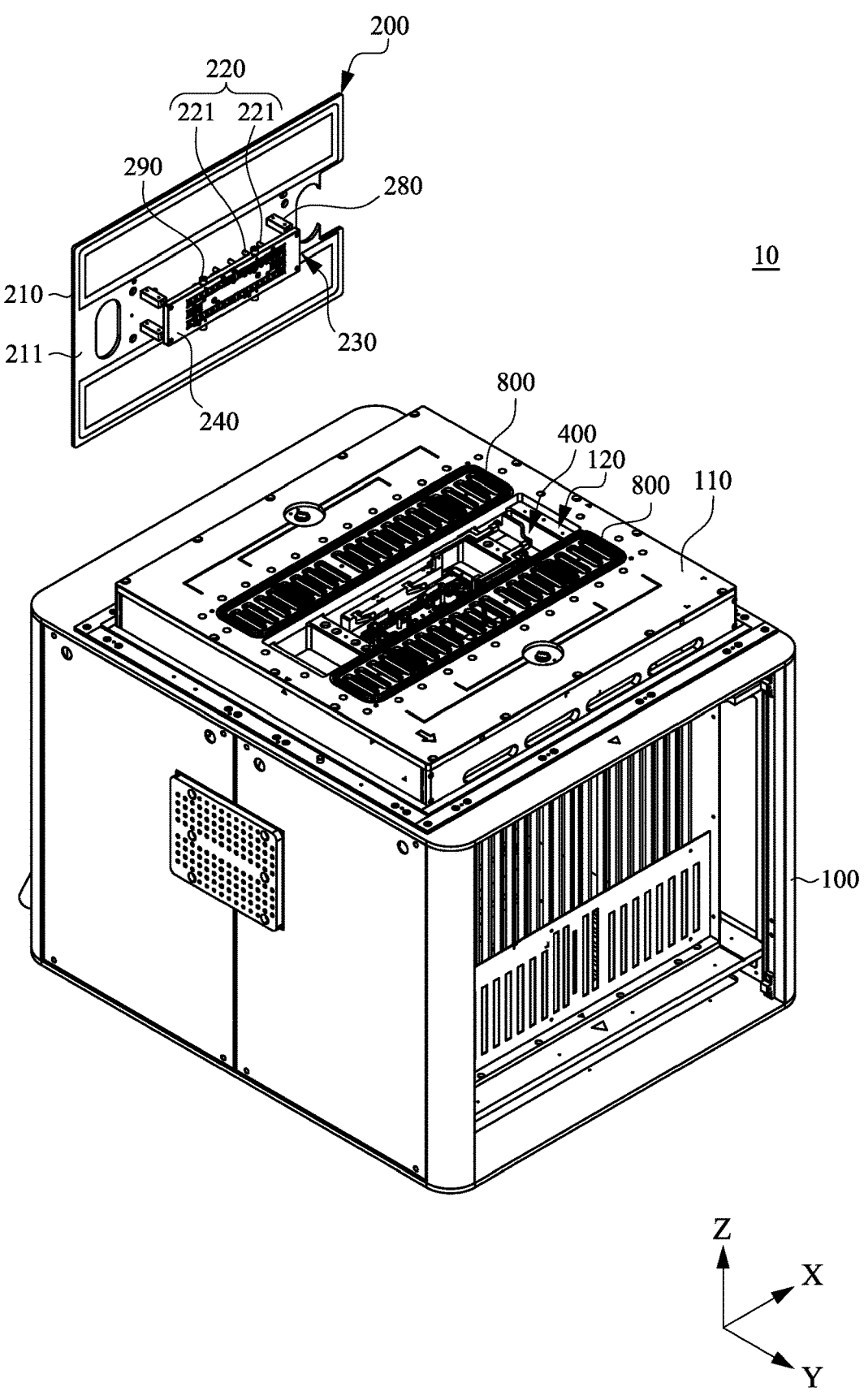
FIG. 3 is a partial disassembly view of the testing device of FIG. 1.

FIG. 3 is a partial disassembly view of the testing device of FIG. 1. As shown in FIG. 2 and FIG. 3, in the embodiment, the top surface 110 of the base 100 is recessed with a slot 120. The transferring device 400 is located within the slot 120 and able to be exposed outwards from the slot 120. The testing device 10 further includes multiple (for example, two) vacuum suction modules 800. These vacuum suction modules 800 are located on the top surface 110 of the base 100, and the slots 120 are located between the vacuum suction modules 800. These vacuum suction modules 800 are externally connected to a vacuum source device (not shown in figures) for fixing the load board module 200 to the top surface 110 of the base 100 through vacuum suction method.

Figure 4A:
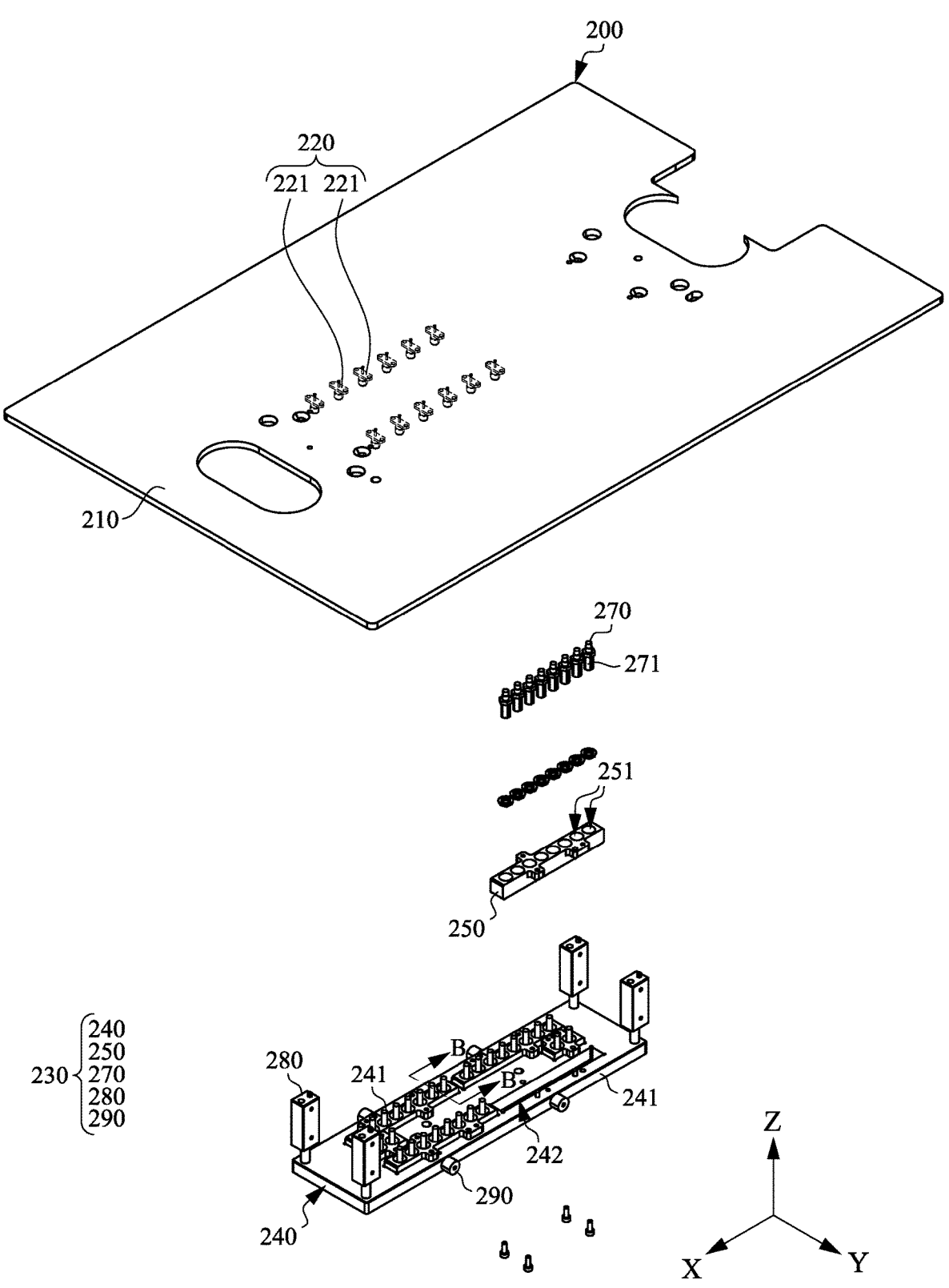
FIG. 4A is a partial disassembly view of the load board module of FIG. 1.

FIG. 4A is a partial disassembly view of the load board module 200 of FIG. 1. Specifically, as shown in FIG. 3 and FIG. 4A, the load board module 200 includes a circuit board 210, a first circuit interface 220, an upper connection module 230 and a plurality of partition columns 280. A bottom surface 211 of the circuit board 210 covers the top surface 110 of the base 100 and the vacuum suction modules 800, and the bottom surface 211 of the circuit board 210 is adsorbed to be fixed on the top surface 110 of the base 100 by the vacuum suction modules 800. The first circuit interface 220 is disposed on the bottom surface 211 of the circuit board 210. For example, the first circuit interface 220 includes a plurality of first connectors 221 spaced arranged on the bottom surface 211 of the circuit board 210. The upper connection module 230 is fixedly connected to the bottom surface 211 of the circuit board 210, and electrically connected to the first circuit interface 220. In this embodiment, the upper connection module 230 is separately fixed on the bottom surface 211 of the circuit board 210 through these partition columns 280. The working module 300 includes a second circuit interface 310 (FIG. 2). The second circuit interface 310 includes a plurality of second connectors 311 spacedly distributed on the working module 300. In this embodiment, the working module 300 is, for example, an RF testing module or other modules. However, the disclosure is not limited thereto.

In this embodiment, as shown in FIG. 3 and FIG. 4A, the upper connection module 230 includes a strip-shaped frame 240, one or more bracket elements 250, a plurality of upper cables 260 (FIG. 2), a plurality of upper adapter units 270. Each of the partition columns 280 is disposed between the strip-shaped frame 240 and the circuit board 210, and two ends of each of the partition columns 280 are connected to the strip-shaped frame 240 and the circuit board 210, respectively. The bracket elements 250 are spacedly fixed on the strip-shaped frame 240. For example, the strip-shaped frame 240 is further provided with a plurality of first openings 242 spaced apart from each other on the strip-shaped frame 240. Each of the bracket elements 250 inserts into one of the first openings 242 so as to be positioned on the strip-shaped frame 240.

Each of the bracket elements 250 includes a plurality of through holes 251, and the through holes 251 are linearly arranged on the bracket element 250 in a long axis direction of this bracket element 250. Each of the through holes 251 is penetrated through this bracket element 250. The upper adapter units 270 are respectively held in these through holes 251 one by one, that is, each of the upper adapter unit 270 is held within one of the through holes 251, and this upper adapter unit 270 is electrically connected to one of the first connectors 221 through one of the upper cables 260. In addition, the upper connection module 230 further includes a plurality of wheels 290 respectively pivoted to two opposite sides 241 of the strip-shaped frame 240 of the upper connection module 230.

Figure 4B:
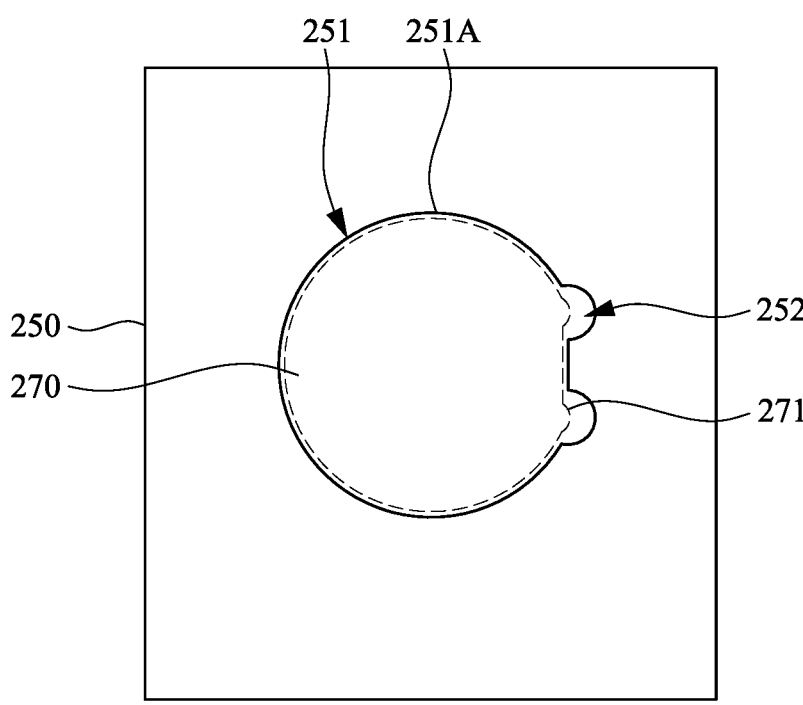
FIG. 4B is a partial cross-sectional view of the upper connection module viewed along a line BB of FIG. 4A.

FIG. 4B is a partial cross-sectional view of the upper connection module 230 viewed along a line BB of FIG. 4A. As shown In FIG. 4A and FIG. 4B, the inner wall 251A of each of the through holes 251 is further formed with two limiting grooves 252 arranged spaced with each other, and a long axis direction of each of the limiting grooves 252 is parallel to a long axis direction of each of the through holes 251 (i.e., Z axis). One side of each of the upper adapter unit 270 is provided with two protruding planes 271 arranged spaced with each other, and the long axis direction of one of the protruding planes 271 is parallel to the long axis of the through hole 251 (i.e., Z axis). Therefore, when the upper adapter unit 270 extends into the corresponding through hole 251 along Z axis, and each of the protruding planes 271 extends into the corresponding limiting groove 252, the protruding planes 271 are exactly limited in the limiting grooves 252 for preventing the upper adapter unit 270 from rotating in the corresponding through hole 251.

Figure 5:
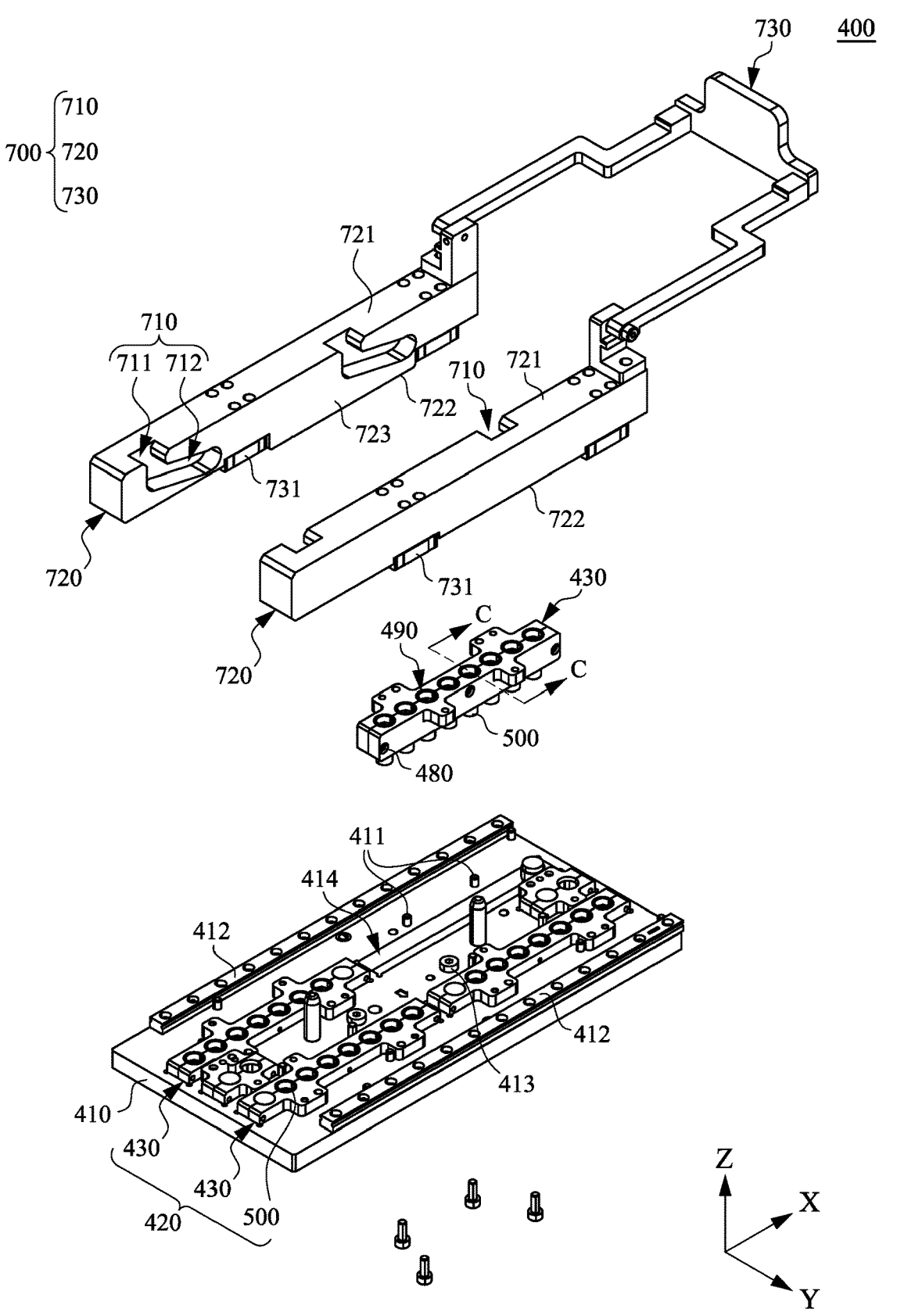
FIG. 5 is a disassembly view of the transferring device of FIG. 1.
Figure 6:
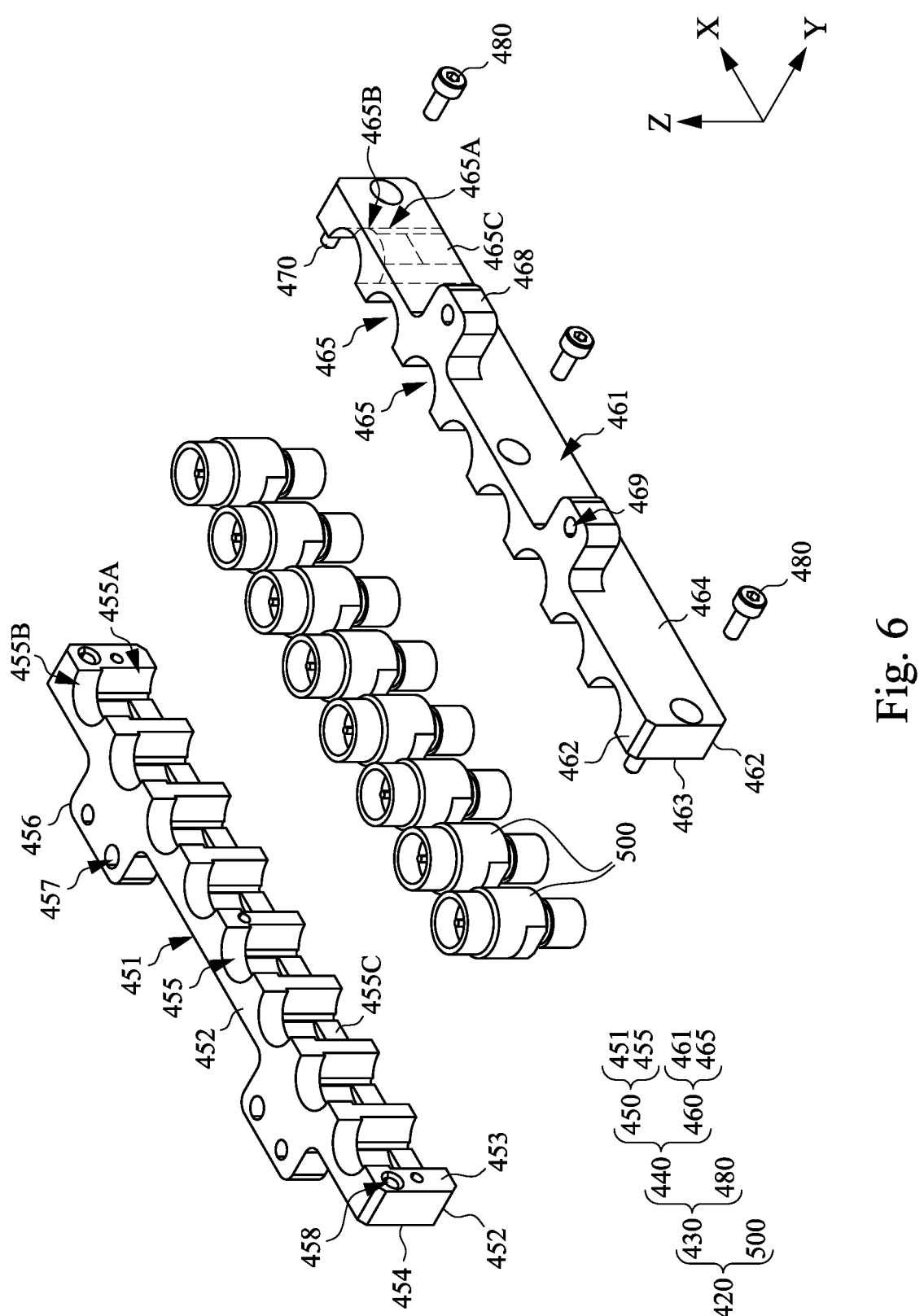
FIG. 6 is a disassembly view of the lower connection module of FIG. 5.
Figure 7:
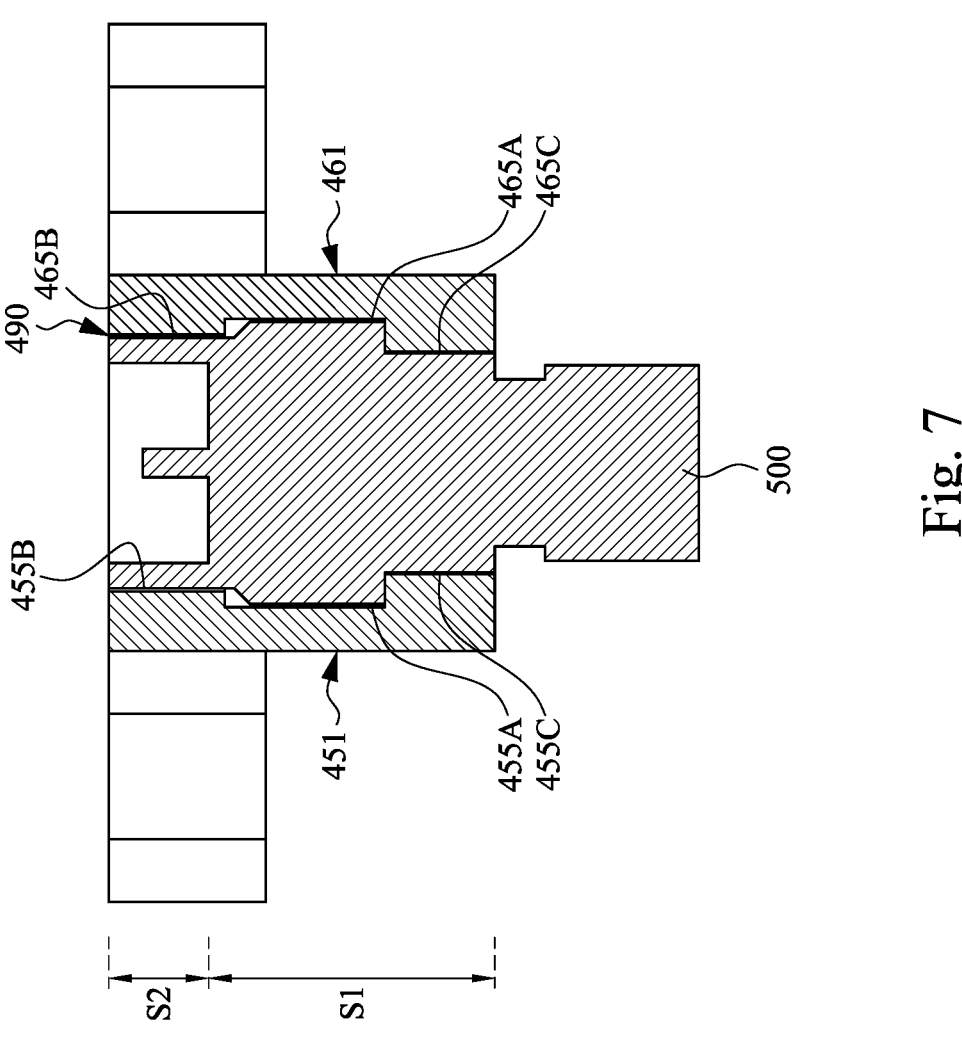
FIG. 7 is a cross-sectional view of the lower connection module viewed along a line CC of FIG. 5.

FIG. 5 is a disassembly view of the transferring device 400 of FIG. 1. FIG. 6 is a disassembly view of the lower connection module 420 of FIG. 5. FIG. 7 is a cross-sectional view of the lower connection module 420 viewed along a line CC of FIG. 5. As shown In FIG. 5 to FIG. 7, the transferring device 400 includes a support plate 410 and a lower connection module 420. The support plate 410 is fixed between the working module 300 and the load board module 200 (FIG. 2). The lower connection module 420 includes a plurality of adapter holders 430, a plurality of lower adapter units 500, and a plurality of lower cables 510 (FIG. 2). The adapter holders 430 are fixedly held on the support plate 410, and spacedly distributed on the support plate 410. For example, the support plate 410 is further formed with a plurality of second openings 414 spaced apart from each other. Each of the adapter holders 430 inserts into one of the second openings 414 so as to be positioned on the support plate 410.

As shown in FIG. 6, each of the adapter holders 430 includes a holder body and a plurality of first fixing elements 480. The holder body 440 includes a first strip-shaped body 450 and a second strip-shaped body 460. The first strip-shaped body 450 includes a first main body 451 and a plurality of first notches 455. The first main body 451 includes two first adjoining surfaces 452, a first coupling surface 453 and a first outer surface 454. The first adjoining surfaces 452 are opposite to each other, the first coupling surface 453 and the first outer surface 454 are opposite to each other, and the first coupling surface 453 is adjoined with the first adjoining surfaces 452. The first notches 455 are respectively formed and linearly arranged on the first coupling surface 453, that is, each of the first notches 455 is concavely formed on the first coupling surface 453, and respectively connected to the first adjoining surfaces 452. The second strip-shaped body 460 includes a second main body 461 and a plurality of second notches 465. The second main body 461 includes two second adjoining surfaces 462, a second coupling surface 463 and a second outer surface 464. The second coupling surface 463 and the second outer surface 464 are opposite to each other, the second adjoining surfaces 462 are opposite to each other, and the second coupling surface 463 is adjoined with the second adjoining surfaces 462. The second notches 465 are respectively formed and linearly arranged on the second coupling surface 463, that is, each of the second notches 465 is concavely formed on the second coupling surface 463, and respectively connected to the second adjoining surfaces 462. The first fixing element 480 is used to detachably couple the first strip-shaped body 450 and the second strip-shaped body 460 together, so that the first coupling surface 453 and the second coupling surface 463 are physically connected together, and the first notches 455 and the second notches 465 are jointly combined to form a plurality of first fastening holes 490 linearly arranged on the lower connection module 420 in a long axis direction of this lower connection module 420. Each of the first fastening holes 490 is formed by one of the first notches 455 and one of the second notches 465, and used to fixedly hold one of the lower adapter units 500. Two ends of each of the lower adapter units 500 are electrically connected to the second circuit interface 310 of the working module 300 and the upper connection module 230, respectively (FIG. 2). However, the disclosure is not limited thereto. In other embodiments, the first fastening holes may also hold other similar objects.

More specifically, in this embodiment, each of the lower adapter units 500 is electrically connected to one of the second connectors 311 of the working module 300 through one of the lower cables 510 (FIG. 2). In addition, each of the first fixing elements 480 is, for example, a bolt, and the bolt can penetrate through the first main body 451 and the second main body 461, so that the first main body 451 and the second main body 461 are tightly coupled to each other. However, the disclosure is not limited thereto. In other embodiments, each of the first fixing elements may also be a magnet, a clamp or other similar components.

Furthermore, the first strip-shaped body 450 further includes a plurality of shaft-received holes 458 respectively disposed on the first coupling surface 453 of the first strip-shaped body 450. The second strip-shaped body 460 further includes a plurality of positioning shafts 470 respectively disposed on the second coupling surface 463 of the second strip-shaped body 460. Thus, when the first strip-shaped body 450 and the second strip-shaped body 460 are closed to each other so that each of the positioning shafts 470 is aligned with and inserted into one of the shaft-received holes 458, the first notches 455 are aligned with, and connected to the second notches 465 one by one.

Each of the first notches 455 is formed with a first section 455A and a second section 455B connected to each other. The first section 455A is connected to the lower one of the first adjoining surfaces 452, and the second section 455B is connected to the upper one of the first adjoining surfaces 452. Each of the second notches 465 is formed with a third section 465A and a fourth section 465B connected to each other, the third section 465A is connected to the lower one of the second adjoining surfaces 462, and the fourth section 465B is connected to the upper one of the second adjoining surfaces 462. Thus, as shown in FIG. 6 and FIG. 7, when the first strip-shaped body 450 and the second strip-shaped body 460 are closed to each other so that the first coupling surface 453 and the second coupling surface 463 are physically connected together, a caliber of a first space S1 jointly formed by the first section 455A and the third section 465A is smaller than a caliber of a second space S2 jointly formed by the second section 455B and the fourth section 465B.

As shown in FIG. 6 and FIG. 7, an inner wall of the first section 455A is provided with a first clamping plane 455C, and an inner wall of the third section 465A is provided with a second clamping plane 465C. Thus, when the first coupling surface 453 and the second coupling surface 463 are physically connected together so as to couple the first section 455A and the third section 465A together, the lower adapter units 500 are jointly sandwiched by the first clamping plane 455C and the second clamping plane 465C for preventing each of the lower adapter unit 500 from rotating in the corresponding first fastening hole 490.

As shown in FIG. 5 and FIG. 6, the first strip-shaped body 450 further includes a plurality of first lugs 456. Each of the first lugs 456 is protrusively disposed on the first outer surface 454 of the first main body 451 facing away from the first coupling surface 453. Each of the first lugs 456 is formed with a first positioning hole 457. The second strip-shaped body 460 further includes a plurality of second lugs 468, and each of the second lugs 468 is protrusively disposed on the second outer surface 464 of the second main body 461 facing away from the second coupling surface 463. Each of the second lugs 468 is formed with a second positioning hole 469. By extending the positioning pins 411 on the support plate 410 into the first positioning holes 457 and the second positioning holes 469, the adapter holders 430 can be positioned on the support plate 410.

As shown in FIG. 5, the transferring device 400 further includes a moving assembly 700 slidably disposed on the support plate 410, that is, the moving assembly 700 can move linearly along a transverse direction (i.e., X-axis). For example, the support plate 410 is further provided with two linear guide rails 412 spaced apart.

Specifically, the moving assembly 700 includes a handle 730, two pillar shafts 720 and at least two grooves 710. The handle 730 is pivotally connected to one end of each of the pillar shafts 720. These pillar shafts 720 are spaced apart and arranged parallel along the Y-axis. Each of the pillar shafts 720 is formed with a top surface 721, a bottom surface 722 and two side surfaces 723. The top surface 721 and the bottom surface 722 are opposite to each other, and the side surfaces 723 are opposite to each other. Each of the side surfaces 723 is adjoined to the top surface 721 and the bottom surface 722. The side surfaces 723 of the pillar shafts 720 are faced with each other. The grooves 710 are respectively located symmetrically on the pillar shafts 720. The bottom surface 722 of the pillar shafts 720 is further formed with two joint portions 731. Each of the joint portions 731 of the moving assembly 700 is engaged with one of the linear guide rails 412, so that the moving assembly 700 is linearly movable along an axis direction of one of the linear guide rails 412 (e.g., X axis), however, the disclosure is not limited thereto. Each of the grooves 710 includes an inlet 711 and a sloping area 712. The inlet 711 is collectively formed on the top surface 721 and the side surface of the corresponding one of the pillar shafts 720. The sloping area 712 is disposed on the side surface 723 of the corresponding one of the pillar shafts 720. One end of the sloping area 712 is connected to the inlet 711, and the other end thereof gradually slopes in a direction of the working module 300 and the handle 730 from the top surface 721 of the pillar shaft 720 (FIG. 2).

Figure 8A:
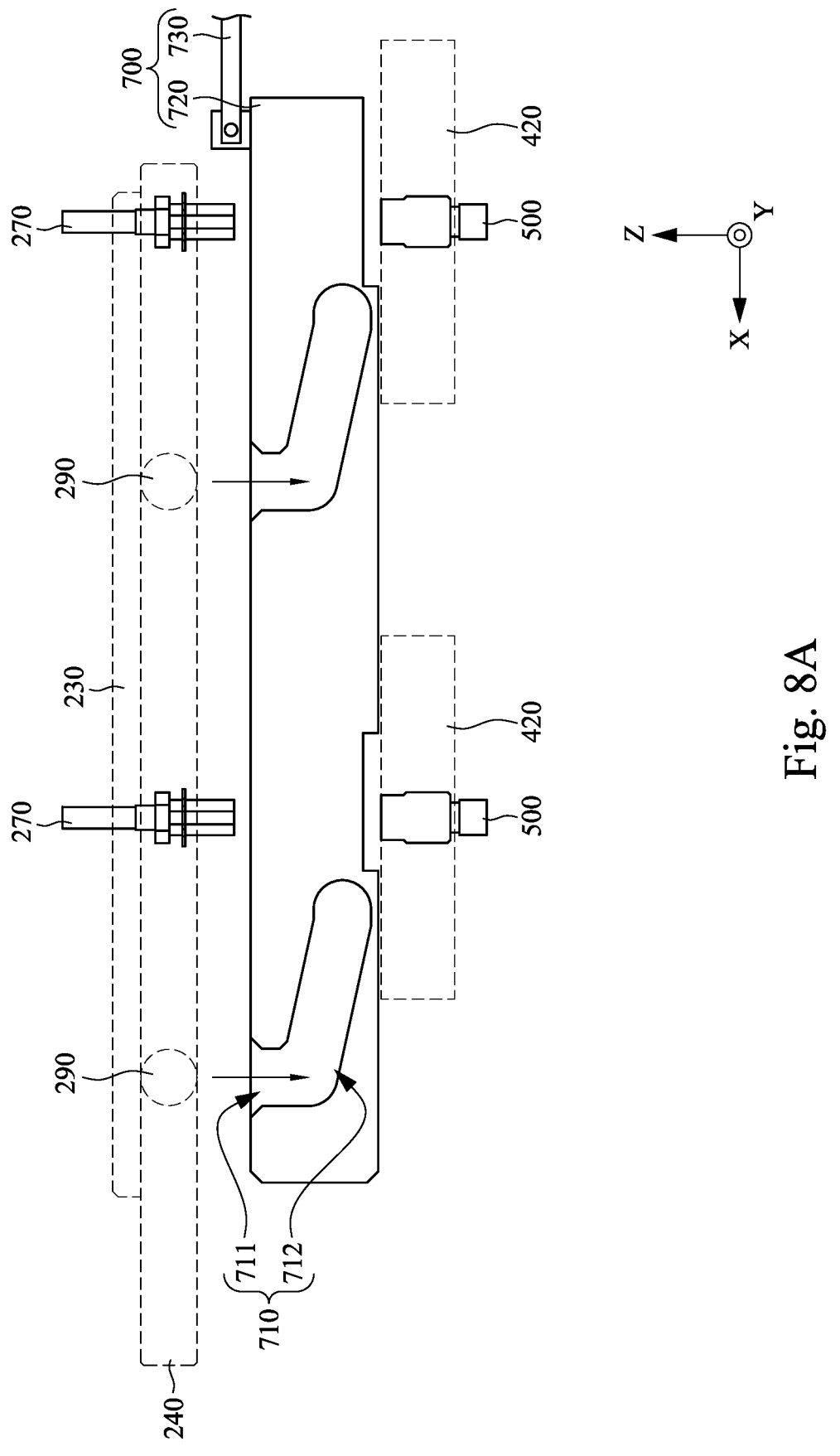
FIG. 8A to FIG. 8C are continuous operation views of movements of the upper connection module and the transferring device.
Figure 8B:
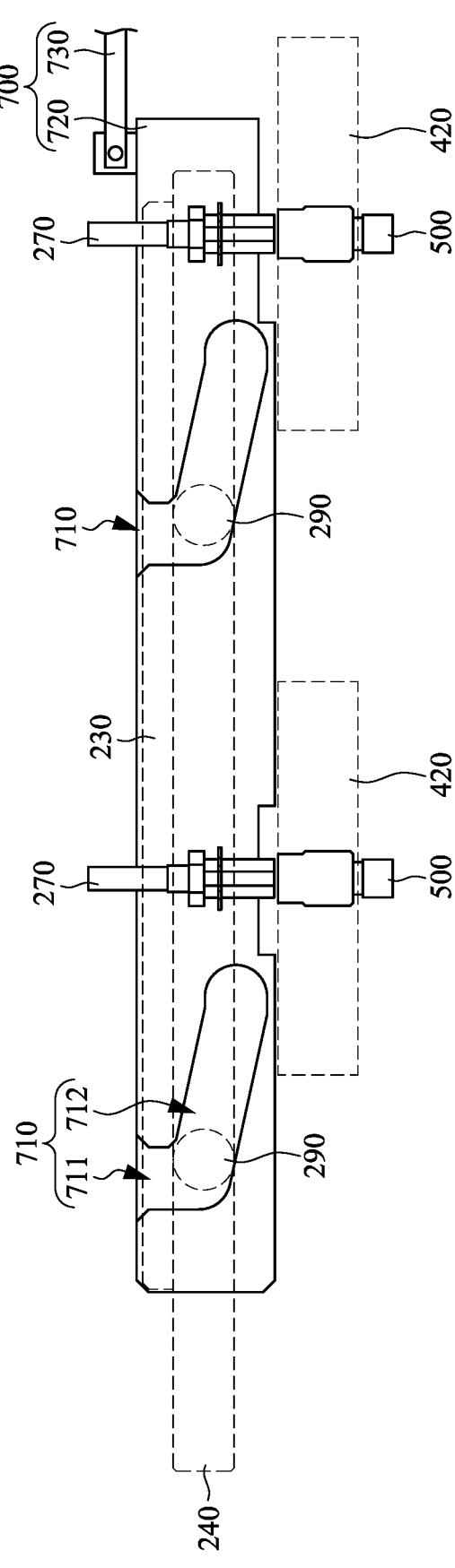
Figure 8C:
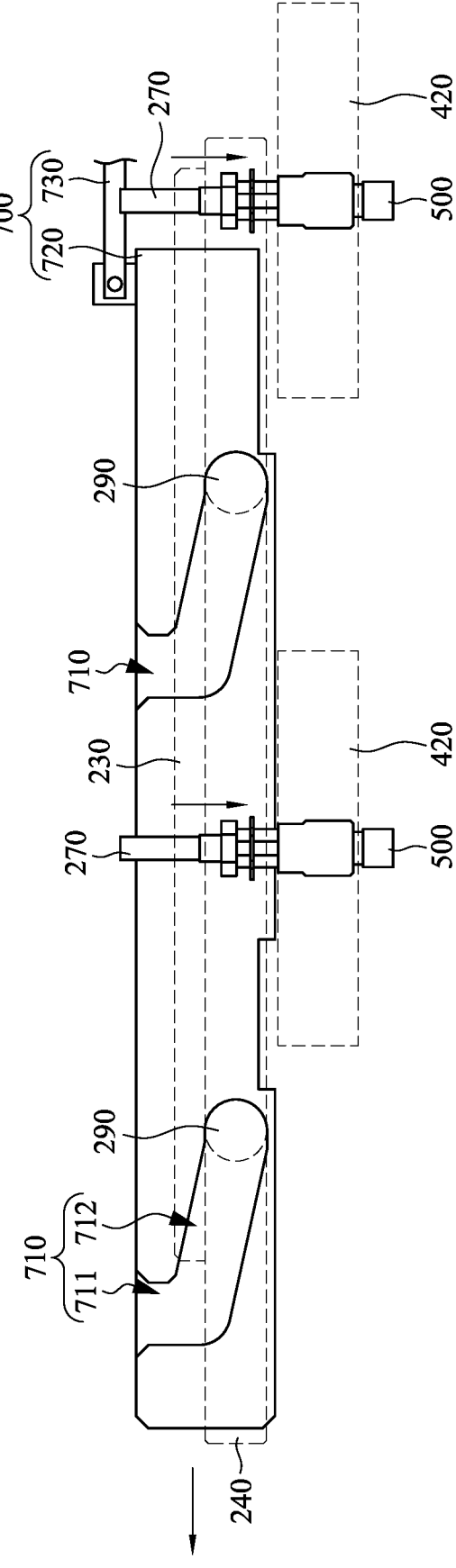

FIG. 8A to FIG. 8C are continuous operation views of movements of the upper connection module 230 and the transferring device 400. As shown in FIG. 8A and FIG. 8B, when the wheels 290 of the strip-shaped frame 240 are respectively moved into the grooves 710 from their inlets 711 synchronously by a user, the upper connection module 230 vertically descends towards the lower connection module 420. Next, as shown in FIG. 8B and FIG. 8C, when the user pushes the above-mentioned moving assembly 700 along the transverse direction (e.g., X-axis) through the handle 730 (FIG. 5), due to each of the wheels 290 of the upper connection module 230 being pressed by the sloping area 712 of one of the grooves 710, the upper connection module 230 is guided to generate a vertical descending (along Z-axis), so that each of the upper adapter unit 270 can be vertically inserted into the corresponding one of the lower adapter units 500 (FIG. 8C).

It is noted, since the support plate 410 is further provided with floating screws 413 thereon, when the upper connection module 230 vertically descends to the support plate 410, the floating screws 413 may abut the upper connection module 230 to buffer the pressure of the upper connection module 230 for protecting these lower adapter units 500 of the lower connection module 420.

Figure 9B:
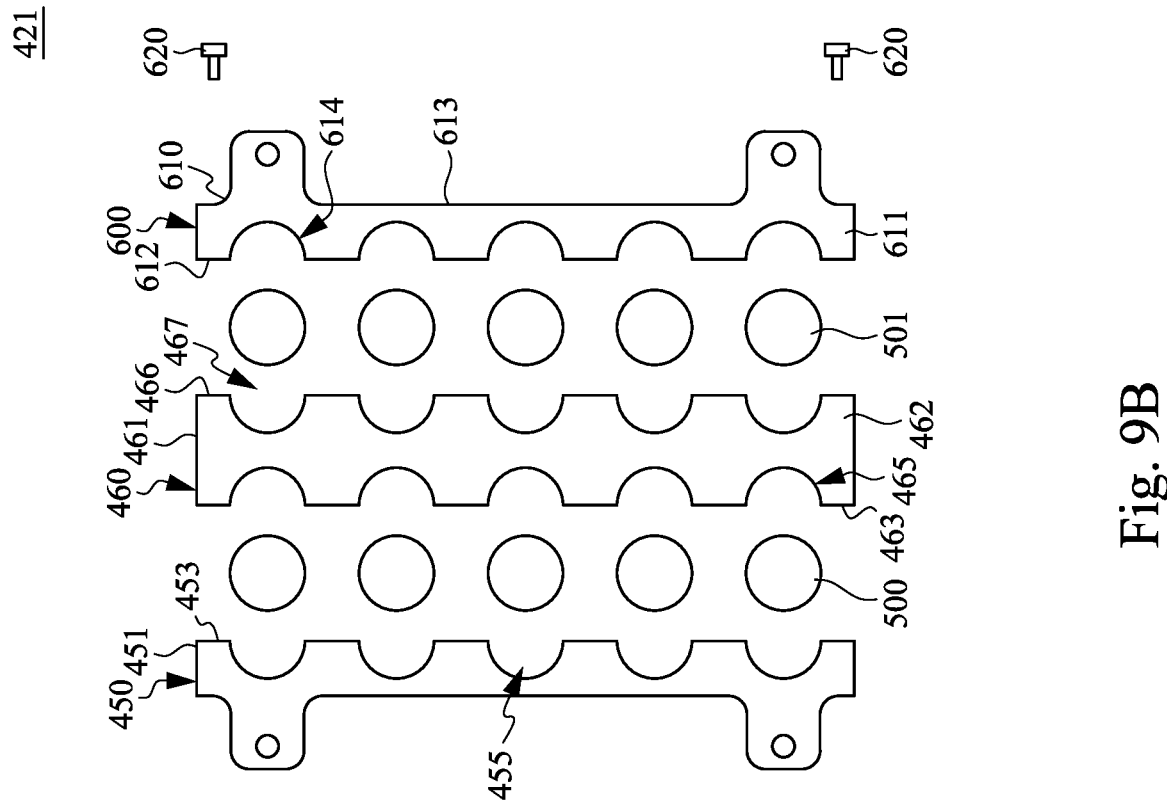
FIG. 9B is an assembly view of the lower connection module of FIG. 9A.
Figure 9A:
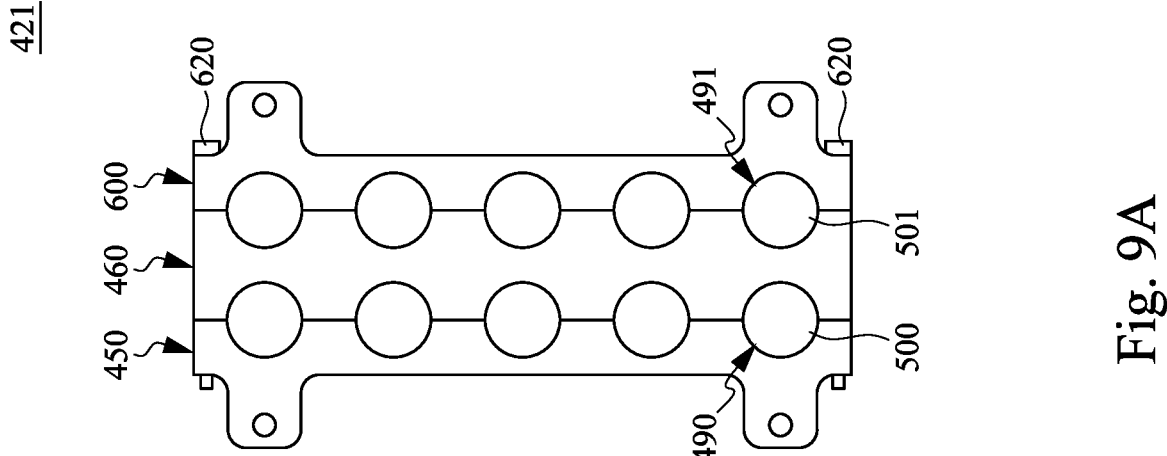
FIG. 9A is a disassembly schematic view of a lower connection module according to one embodiment of the present disclosure.

FIG. 9A is a disassembly schematic view of a lower connection module 421 according to one embodiment of the present disclosure. FIG. 9B is an assembly view of the lower connection module 421 of FIG. 9A. As shown in FIG. 9A and FIG. 9B, the lower connection module 421 of the embodiment and the lower connection module 420 of the abovementioned embodiment are substantially the same, and one of the differences is that, in addition to the first strip-shaped body 450 and the second strip-shaped body 460, each of the adapter holders 430 further includes a third strip-shaped body 600 and at least one second fixing element 620, and the second strip-shaped body 460 is detachably disposed between the first strip-shaped body 450 and the third strip-shaped body 600.

Specifically, the third strip-shaped body 600 includes a third main body 610 and a plurality of third notches 614. The third main body includes two third adjoining surfaces 611, a third coupling surface 612 and a third outer surface 613. The third coupling surface 612 and the third outer surface 613 are opposite to each other, the third adjoining surfaces 611 are opposite to each other, and the third coupling surface 612 is adjoined with the third adjoining surfaces 611 and facing towards the second main body 461. The third notches 614 are respectively formed and linearly arranged on the third coupling surface 612, and each of the third notches 614 is connected to the third adjoining surfaces 611, that is, each of the third notches 614 is concavely formed on the third coupling surface 612, and respectively connected to the third adjoining surfaces 611. The second main body 461 further includes a fourth coupling surface 466 adjoined with the second adjoining surfaces 462 and facing away from the first main body 451. The second strip-shaped body 460 further includes a plurality of fourth notches 467 respectively formed and linearly arranged on the fourth coupling surface 466, that is, each of the fourth notches 467 is concavely formed on the fourth coupling surface 466, and respectively connected to the second adjoining surfaces 462. The second fixing element 620 is used to detachably couple the third strip-shaped body 600 and the second strip-shaped body 460 together, so that the third coupling surface 612 and the fourth coupling surface 466 are physically connected together, and the third notches 614 and the fourth notches 467 are jointly combined to form a plurality of second fastening holes 491 linearly arranged on the lower connection module 421 in a long axis direction of this lower connection module 421. Each of the second fastening holes 491 is formed by one of the third notches 614 and one of the fourth notches 467, and used to fixedly hold another lower adapter unit 501 or likes. Two ends of the another lower adapter unit 501 are electrically connected to the working module 300 and the upper connection module 230, respectively (FIG. 2). However, the disclosure is not limited thereto. In other embodiments, the first fastening holes may also hold other similar objects.

In addition, each of the second fixing elements 620 is, for example, a bolt, and the bolt can penetrate through the first main body 451, the second main body 461 and the third main body 610, so that the first main body 451, the second main body 461 and the third main body 610 are tightly coupled to each other. However, the disclosure is not limited thereto. In other embodiments, each of the first fixing elements may also be a magnet, a clamp or other similar components.

Thus, through the construction of the embodiments above, the adapter holder of the disclosure can comfort with specific sizes of adapters so as to effectively hold these adapters, thereby reducing labor costs, equipment costs and testing time.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. An adapter holder, comprising:
a holder body comprising a first strip-shaped body and a second strip-shaped body, the first strip-shaped body comprising a first main body and a plurality of first notches, the first main body comprising two first adjoining surfaces which are opposite to each other, and a first coupling surface adjoined with the first adjoining surfaces, the first notches linearly arranged on the first coupling surface, each of the first notches connected to the first adjoining surfaces, the second strip-shaped body comprising a second main body and a plurality of second notches, the second main body comprising two second adjoining surfaces which are opposite to each other, and a second coupling surface adjoined with the second adjoining surfaces, the second notches linearly arranged on the second coupling surface, and each of the second notches connected to the second adjoining surfaces; and
at least one first fixing element detachably coupling the first strip-shaped body and the second strip-shaped body together, so that the first coupling surface and the second coupling surface are physically connected together, and the first notches and the second notches are jointly combined to form a plurality of first fastening holes linearly arranged, wherein each of the first fastening holes is used to fix an object therein.

2. The adapter holder of claim 1, wherein the first strip-shaped body further comprises at least one shaft-received hole disposed on the first coupling surface; and
the second strip-shaped body further comprises at least one positioning shaft disposed on the second coupling surface,
wherein when the at least one positioning shaft is aligned with and inserted into the at least one shaft-received hole, the first notches are aligned with, and connected to the second notches one by one.

3. The adapter holder of claim 1, wherein each of the first notches is formed with a first section and a second section connected to each other, the first section is connected to one of the first adjoining surfaces, and the second section is connected to the other of the first adjoining surfaces; and
each of the second notches is formed with a third section and a fourth section connected to each other, the third section is connected to one of the second adjoining surfaces, and the fourth section is connected to the other of the second adjoining surfaces,
wherein when the first coupling surface and the second coupling surface are physically connected together, a caliber of a first space jointly formed by the first section and the third section is smaller than a caliber of a second space jointly formed by the second section and the fourth section.

4. The adapter holder of claim 3, wherein an inner wall of the first section is provided with a first clamping plane, and an inner wall of the third section is provided with a second clamping plane,
wherein when the first coupling surface and the second coupling surface are physically connected together, the object is jointly sandwiched by the first clamping plane and the second clamping plane.

5. The adapter holder of claim 1, wherein the first strip-shaped body further comprises at least one first lug protrusively disposed on a first outer surface of the first main body facing away from the first coupling surface, and a first positioning hole formed on the at least one first lug; and the second strip-shaped body further comprises at least one second lug protrusively disposed on a second outer surface of the second main body facing away from the second coupling surface, and a second positioning hole formed on the at least one second lug.

6. A testing device, comprising:

a base;

a load board module, comprising:

a circuit board covering the base;

a first circuit interface disposed on one surface of the circuit board; and an upper connection module fixedly connected to the surface of the circuit board, and electrically connected to the first circuit interface;

at least one working module fixedly disposed within the base, and provided with a second circuit interface; and a transferring device, comprising:

a support plate fixed between the at least one working module and the load board module; and a lower connection module comprising a plurality of lower adapter units and the adapter holder of claim 1, the adapter holder that is held on the support plate, and each of the lower adapter units that is held within one of the first fastening holes and electrically connected to the second circuit interface and the upper connection module, respectively.

7. The testing device of claim 6, wherein the transferring device further comprises:

a moving assembly slidably disposed on the support plate, and the moving assembly comprising a handle, two pillar shafts and two grooves, the handle that is pivotally connected to one end of each of the pillar shafts, each of the pillar shafts that is formed with a top surface and a side surface adjoined with the top surface, and the side surfaces of the pillar shafts faced with each other, the grooves respectively formed on the side, wherein each of the grooves comprises an inlet and a sloping area, the inlet is collectively formed on the top surface and the side surface of the corresponding one of the pillar shafts, the sloping area is disposed on the side surface of the corresponding one of the pillar shafts, connected to the inlet, and gradually sloping in a direction of the at least one working module and the handle from the top surface.

* * * * *